(12) United States Patent
Yamada et al.

(10) Patent No.: US 8,007,968 B2
(45) Date of Patent: Aug. 30, 2011

(54) SUBSTRATE PROCESSING METHOD, PROGRAM, COMPUTER-READABLE STORAGE MEDIUM AND SUBSTRATE PROCESSING SYSTEM

(75) Inventors: Yoshiaki Yamada, Koshi (JP); Tadayuki Yamaguchi, Minato-ku (JP); Yuuichi Yamamoto, Minato-ku (JP); Yasuhito Saiga, Minato-ku (JP); Kazuo Sawai, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 258 days.

(21) Appl. No.: 12/307,971

(22) PCT Filed: Jul. 25, 2007

(86) PCT No.: PCT/JP2007/065037
§ 371 (c)(1),
(2), (4) Date: Jan. 8, 2009

(87) PCT Pub. No.: WO2008/013310
PCT Pub. Date: Jan. 31, 2008

(65) Prior Publication Data
US 2009/0258304 A1    Oct. 15, 2009

(30) Foreign Application Priority Data

Jul. 28, 2006  (JP) ................................. 2006-205643
May 21, 2007  (JP) ................................. 2007-133807

(51) Int. Cl.
*G03C 5/00* (2006.01)
*G03F 9/00* (2006.01)

(52) U.S. Cl. .......... 430/30; 430/311; 430/322; 430/330; 356/636; 438/7

(58) Field of Classification Search .................... 430/30, 430/311, 322, 330; 356/636; 438/7
See application file for complete search history.

(56) References Cited

FOREIGN PATENT DOCUMENTS

| | | |
|---|---|---|
| JP | 7 147219 | 6/1995 |
| JP | 7 211630 | 8/1995 |
| JP | 2004 95618 | 3/2004 |

*Primary Examiner* — Christopher G Young
(74) *Attorney, Agent, or Firm* — Oblon, Spivak, McClelland, Maier & Neustadt, L.L.P.

(57) ABSTRACT

In the present invention, patterning for the first time is performed on a film to be worked above the front surface of a substrate, and the actual dimension of the pattern formed by the patterning for the first time is measured. Based on the dimension measurement result of the patterning or the first time, the condition of patterning for the second time is then set. In this event, the condition of the patterning for the second time is set so that a difference between the dimension of the patterning for the first time and its target dimension is equal to a difference between the dimension of the patterning for the second time and its target dimension. Thereafter, the patterning for the second time is performed under the set patterning condition.

18 Claims, 13 Drawing Sheets

(a)

(b)

(c)

(d)

(a)

(b)

(c)

|  | LINE WIDTH | TARGET LINE WIDTH | LINE WIDTH DIFFERENCE |
|---|---|---|---|
| PATTERNING FOR FIRST TIME | CD1 (52nm) | CD1a (50nm) | ΔCD1 (+2nm) |
| PATTERNING FOR SECOND TIME | CD2 (102nm) | CD2a (100nm) | ΔCD2 (+2nm) |

(a)

(b)

(c)

(d)

(a)

(b)

(c)

(d)

(e)

(a)

(b)

(c)

(d)

|  | NO. 1 | NO. 2 |
|---|---|---|
| PATTERNING FOR FIRST TIME | CD1 (70.5nm) | CD1 (70.5nm) |
| RESIST PATTERNING FOR SECOND TIME | CD2 (69.0nm) | CD2 (71.0nm) |
| CONVERSION DIFFERENCE | CD2−CD1 (−0.5nm) | CD2−CD1 (0.5nm) |
| ETCHING TIME | SHORT | LONG |

SUBSTRATE PROCESSING METHOD, PROGRAM, COMPUTER-READABLE STORAGE MEDIUM AND SUBSTRATE PROCESSING SYSTEM

TECHNICAL FIELD

The present invention relates to a substrate processing method, a program, a computer-readable storage medium, and a substrate processing system.

BACKGROUND ART

In a photolithography step in manufacturing process of, for example, a semiconductor device, for example, a resist coating treatment of applying a resist solution onto a film to be worked on a wafer surface to form a resist film, exposure processing of applying light in a predetermined pattern to the resist film on the wafer surface to expose the resist film, heating processing of heating the wafer to accelerate the chemical reaction in the exposed resist film (post-exposure baking), developing treatment of developing the heated resist film and the like are performed in sequence to form a predetermined resist pattern in the resist film on the wafer surface. Thereafter, the film to be worked is etched using the resist pattern as a mask and the resist pattern is then removed, whereby a predetermined pattern is formed in the film to be worked.

To contemplate miniaturization of the semiconductor device, the light for the exposure processing in the above-described pattern formation is progressively shortened in wavelength. Only with the method of progressively shortening the wavelength for exposure, however, it is technically difficult to form a semiconductor device having a fine line width, for example, at a level of 32 nm or 45 nm. Hence, it is proposed to form a finer pattern by performing patterning a plurality of times on a film to be worked in the same layer on the wafer surface to miniaturize the semiconductor device (see Patent Document 1).

[Patent Document 1]
Japanese Patent Application Laid-open No. H7-147219

DISCLOSURE OF THE INVENTION

Problems to be Solved by the Invention

However, when patterning is performed a plurality of times on the film to be worked in the same layer as described above, specific variations in line width may occur in each patterning because the exposure processing and developing treatment are separately performed for each patterning. If the line width irregularly varies between the plurality of times of patterning, a pattern with a desired dimension is not finally formed, failing to form a desired fine semiconductor device.

The present invention has been developed in consideration of the above viewpoints and its object is to finally form a pattern with a desired dimension on a substrate such as a wafer even when performing patterning a plurality of times.

Means for Solving the Problems

To attain the above object, the present invention is a substrate processing method of performing patterning a plurality of times on films to be worked located in a same layer above a front surface of a substrate, the method including the steps of: performing patterning for a first time; measuring a dimension of a pattern formed by the patterning for the first time; setting a condition of patterning for a second time and subsequent times based on a dimension measurement result of the patterning for the first time; and performing the patterning for the second time and subsequent times under the set condition of patterning.

According to the present invention, since the condition of the patterning for the second time and subsequent times can be controlled based on the dimension of the pattern formed by the patterning for the first time to form a pattern with a desired dimension, the dimension never varies between the plurality of times of patterning, so that a pattern with a desired dimension can be formed.

The condition of patterning for the second time and subsequent times may be set from the dimension measurement result of the patterning for the first time so that a difference between an actual dimension of the pattern for the first time and a target dimension of patterning for the first time is equal to a difference between a dimension of the pattern for the second time and subsequent times and patterning for the second time and subsequent times.

The condition of patterning for the second time and subsequent times may be set from the dimension measurement result of the patterning for the first time so that a dimension of the pattern for the second time and subsequent times is formed in a target dimension set in advance.

A correlation between a difference between the dimension of the pattern for the first time when performing patterning under current condition setting and the target dimension thereof and a difference between the dimension of the pattern for the second time and subsequent times and the target dimension thereof may be obtained in advance, and the condition of patterning for the second time and subsequent times may be set based on the correlation and the dimension measurement result of the patterning for the first time.

The setting of the condition of patterning for the second time and subsequent times may be performed by changing a condition of heating processing performed after exposure processing and before developing treatment.

The setting of the condition of patterning for the second time and subsequent times may be performed by changing a condition of exposure processing.

The setting of the condition of patterning for the second time and subsequent times may be performed by changing a condition of developing treatment.

The substrate may be divided into a plurality of regions, and patterning may be performed on the film to be worked in each of the plurality of regions.

Patterning may be repeatedly performed a plurality of times on the films to be worked in a same region on the front surface of the substrate.

According to another aspect, the present invention is a program running on a computer of a control unit for controlling a substrate processing system to cause the substrate processing system to perform a substrate processing method.

According to still another aspect, the present invention is a computer readable storage medium storing the above program.

According to another aspect, the present invention is a substrate processing system for performing patterning a plurality of times on films to be worked located in a same layer above a front surface of a substrate, the system including: a dimension measuring unit for measuring a dimension of a pattern formed by patterning for a first time; and a control unit for setting a condition of patterning for a second time and subsequent times based on a dimension measurement result of the patterning for the first time.

The control unit may set the condition of patterning for the second time and subsequent times from the dimension measurement result of the patterning for the first time so that a difference between a dimension of the pattern for the first time and its target dimension is equal to a difference between a dimension of the pattern for the second time and subsequent times and its target dimension.

The control unit may set the condition of patterning for the other times from the dimension measurement result of the patterning for the first time so that a dimension of the pattern for the second time and subsequent times is formed in a target dimension set in advance.

The control unit may set the condition of patterning for the second time and subsequent times based on a correlation between a difference between the dimension of the pattern for the first time when performing patterning under current condition setting and the target dimension thereof and a difference between the dimension of the pattern for the second time and subsequent times and the target dimension thereof, and on the dimension measurement result of the patterning for the first time.

The setting of the condition of patterning for the second time and subsequent times may be performed by changing a condition of heating processing performed after exposure processing and before developing treatment.

The setting of the condition of patterning for the second time and subsequent times may be performed by changing a condition of exposure processing.

The setting of the condition of patterning for the second time and subsequent times may be performed by changing a condition of developing treatment.

The substrate may be divided into a plurality of regions, and patterning may be performed on the film to be worked in each of the plurality of regions.

Patterning may be repeatedly performed a plurality of times on the films to be worked in a same region on the front surface of the substrate.

The patterning for the first time may be performed on a first film to be worked, the patterning for the second time and subsequent times may be performed on a second film to be worked formed in the same layer as the first film to be worked after the patterning for the first time, and the setting of the condition of patterning for the second time and subsequent times may be performed by changing an etching time of the second film to be worked.

Effect of the Invention

According to the present invention, a fine pattern with a desired dimension can be formed in a film to be worked above a substrate to advance miniaturization of a semiconductor device.

A table showing the relation between the line width of the pattern for the first time and the line width of the resist pattern for the second time, and the etching time of the anti-reflection film.

EXPLANATION OF CODES 1 coating and developing treatment system
20 pattern dimension measuring unit
170 control unit
B1 pattern for the first time
B2 pattern for the second time
Z1 first region
Z2 second region
M correlation
N correlation
S correlation
W wafer

BEST MODE FOR CARRYING OUT THE INVENTION

Figure 1:
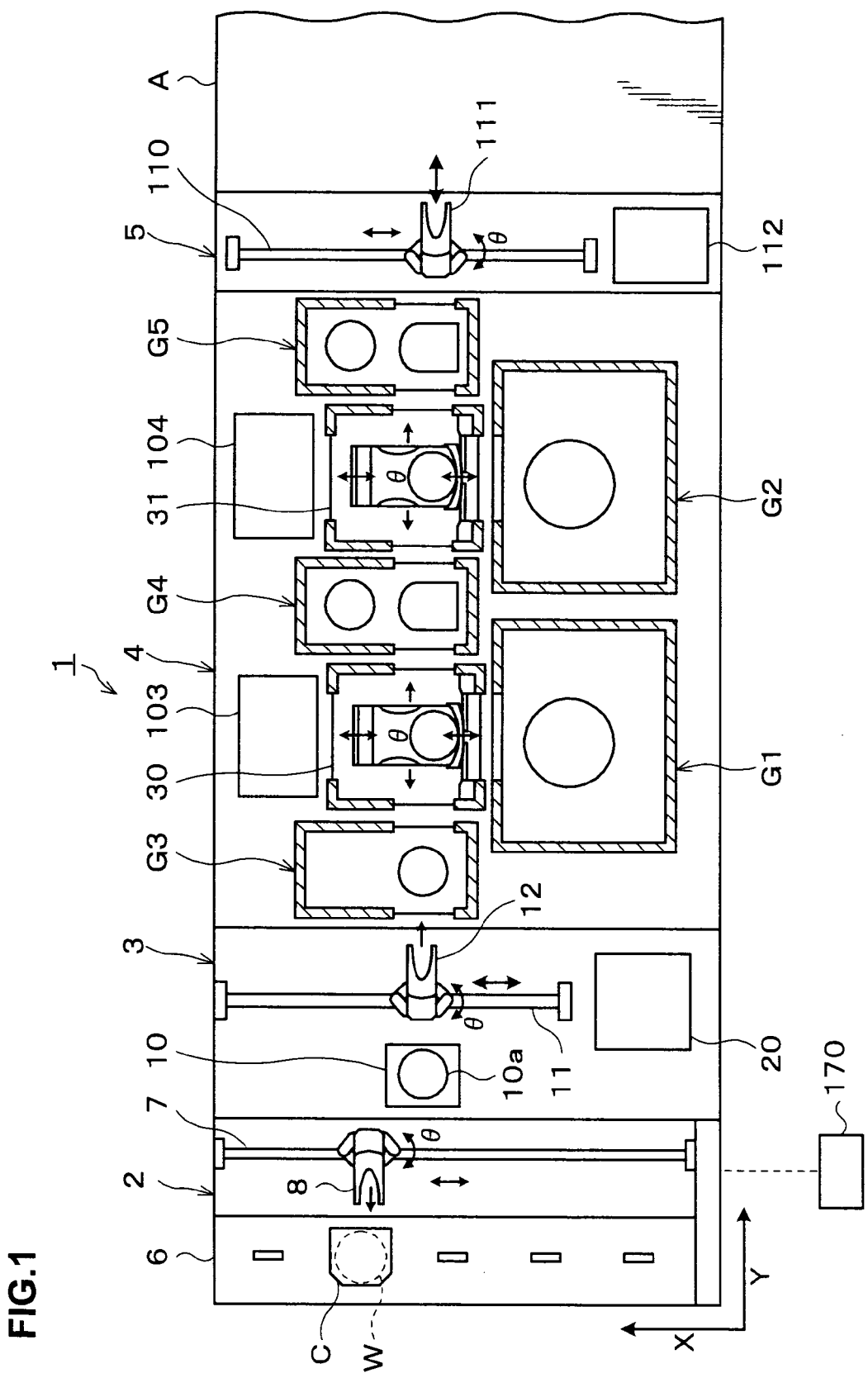
[FIG. 1]
A plan view showing a configuration of a coating and developing treatment system.
Figure 2:
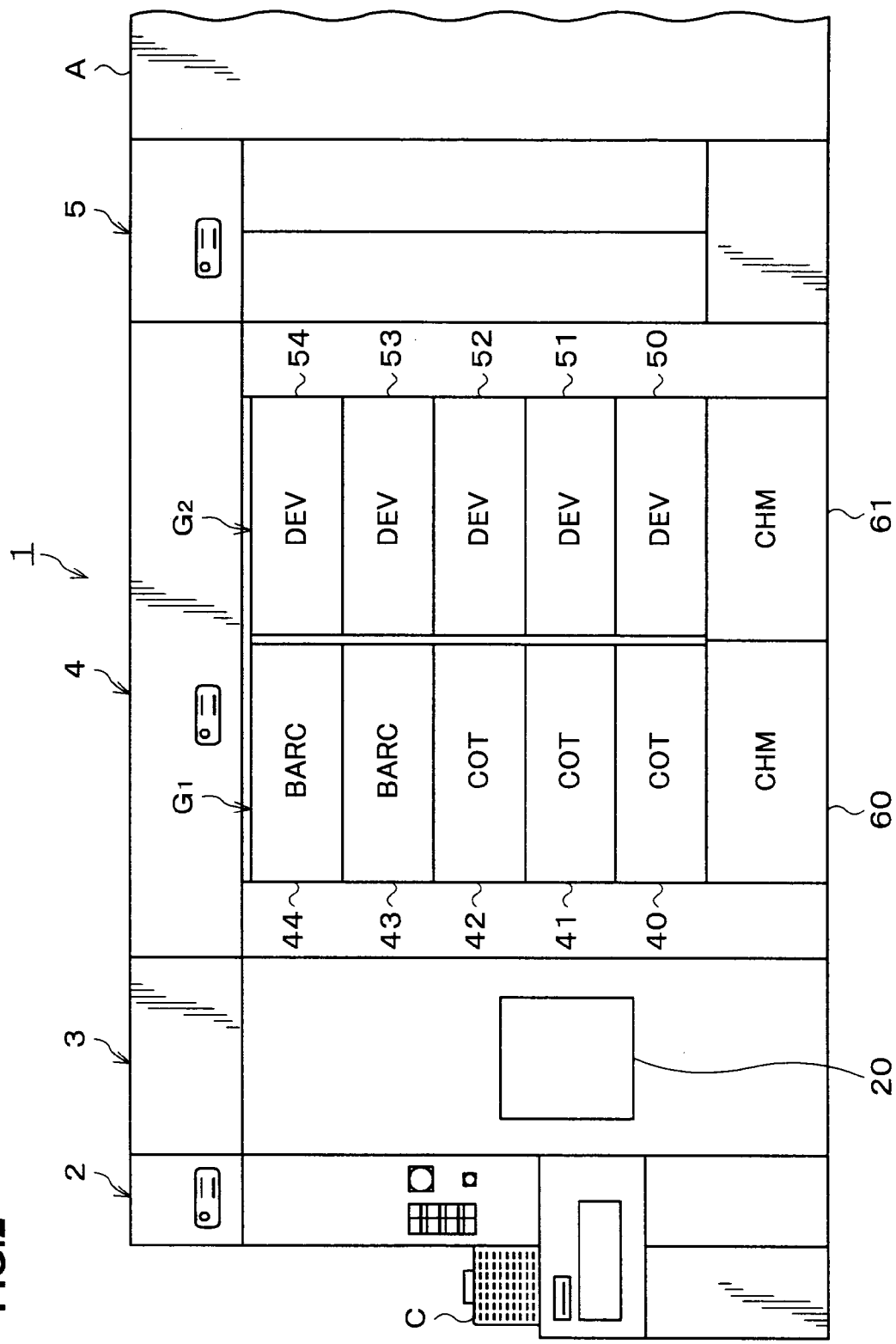
[FIG. 2]
A front view of the coating and developing treatment system in FIG. 1.
Figure 3:
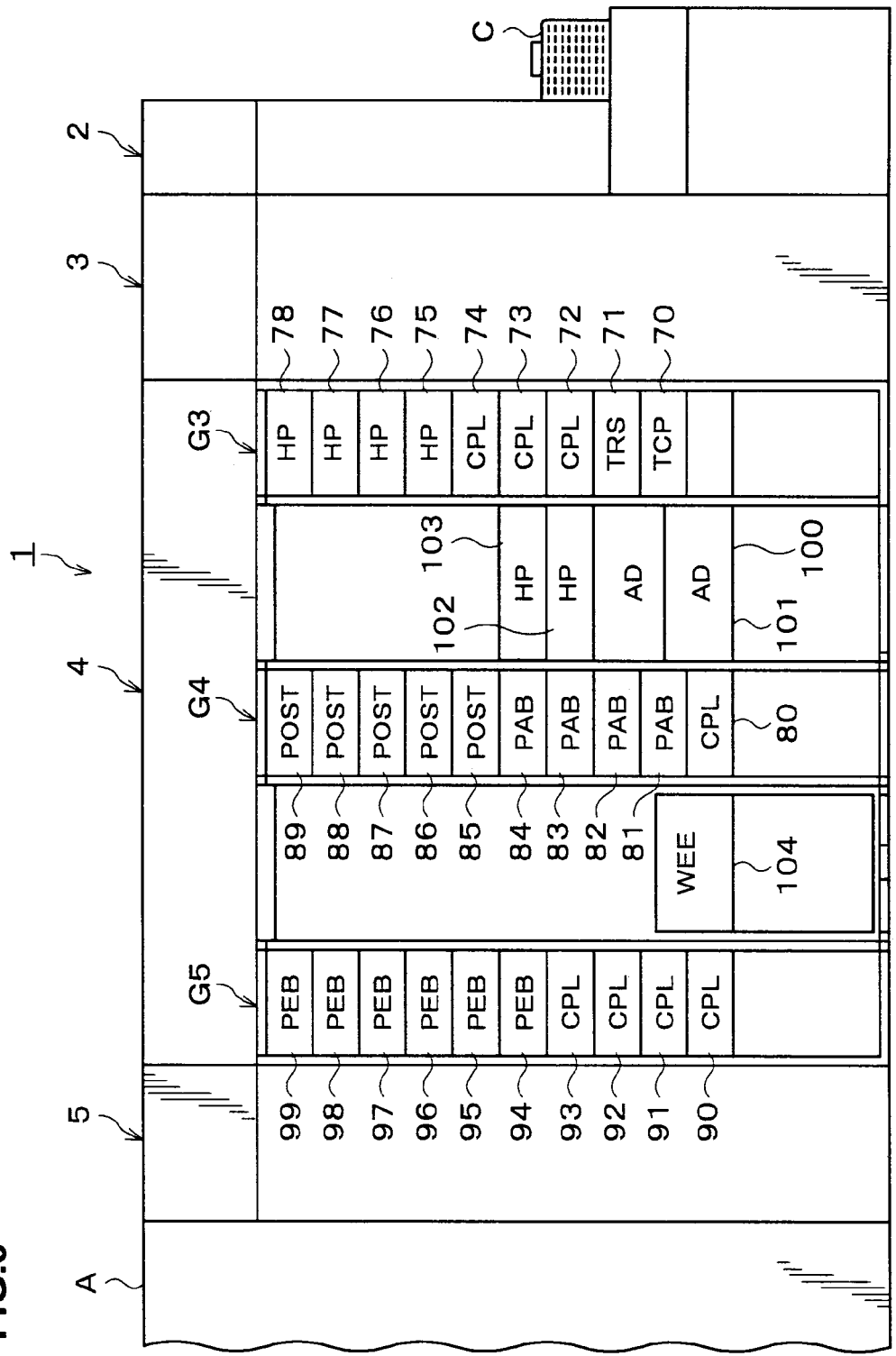
[FIG. 3]
A rear view of the coating and developing treatment system in FIG. 1.

Hereinafter, preferred embodiments of the present invention will be described. FIG. 1 is a plan view showing the outline of a configuration of a coating and developing treatment system 1 as a substrate processing system according to this embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; an inspection station 3 for performing a predetermined inspection on the wafer W; a processing station 4 including a plurality of various kinds of processing and treatment units, which are multi-tiered, for performing predetermined processing or treatment in a manner of single wafer processing in a photolithography process; and an interface section 5 for passing the wafer W to/from an aligner A provided adjacent to the processing station 4, are integrally connected.

In the cassette station 2, a cassette mounting table 6 is provided such that a plurality of cassettes C can be mounted on the cassette mounting table 6 in a line in an X-direction (a top-to-bottom direction in FIG. 1). In the cassette station 2, a wafer transfer body 8 is provided which is movable in the X-direction on a transfer path 7. The wafer transfer body 8 is also movable in a wafer-arrangement direction of the wafers W housed in the cassette C (a Z-direction; the vertical direction), and thus can selectively access the wafers W arranged in the vertical direction in each of the cassettes C. The wafer transfer body 8 is rotatable around an axis in the vertical direction (a θ-direction) and can also access a later-described transition unit 10 on the inspection station 3 side.

In the inspection station 3 adjacent to the cassette station 2, a pattern dimension measuring unit 20 as a dimension measuring unit is provided. The pattern dimension measuring unit 20 is disposed, for example, on the negative direction side in the X-direction (the downward direction in FIG. 1) in the inspection station 3. For example, on the cassette station 2 side in the inspection station 3, the transition unit 10 is disposed for passing the wafer W to/from the cassette station 2. In the transition unit 10, a mounting unit 10a is provided for mounting the wafer W thereon. On the side of the positive direction in the X-direction (the upward direction in FIG. 1) of the pattern dimension measuring unit 20, a wafer transfer unit 12 is provided which is movable in the X-direction on a transfer path 11. The wafer transfer unit 12 is movable, for example, in the vertical direction and also rotatable in the θ-direction, and can access the pattern dimension measuring unit 20, the transition unit 10, and the processing and treatment units in a later-described processing unit group G3 on the processing station 4 side.

The processing station 4 adjacent to the inspection station 3 includes, for example, five processing unit groups G1 to G5 in each of which a plurality of processing and treatment units are multi-tiered. On the side of the negative direction in the X-direction (the downward direction in FIG. 1) in the processing station 4, the first processing unit group G1 and the second processing unit group G2 are placed in order from the inspection station 3 side. On the side of the positive direction in the X-direction (the upward direction in FIG. 1) in the processing station 4, the third processing unit group G3, the fourth processing unit group G4, and the fifth processing unit group G5 are placed in order from the inspection station 3 side. Between the third processing unit group G3 and the fourth processing unit group G4, a first transfer unit 30 is provided. The first transfer unit 30 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 31 is provided. The second transfer unit 31 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 40, 41, and 42 each for applying a resist solution to the wafer W to form a resist film, and bottom coating units 43 and 44 each for forming an anti-reflection film that prevents reflection of light during exposure processing, are five-tiered in order from the bottom. In the second processing unit group G2, solution treatment units, for example, developing treatment units 50 to 54 each for supplying a developing solution to the wafer W to perform developing treatment are five-tiered in order from the bottom. Further, chemical chambers 60 and 61 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a temperature regulating unit 70, a transition unit 71 for passing the wafer W, high-precision temperature regulating units 72 to 74 each for regulating the wafer temperature under temperature control with a high precision, and heating processing units 75 to 78 each for heating-processing the wafer W, are nine-tiered in order from the bottom.

In the fourth processing unit group G4, for example, a high-precision temperature regulating unit 80, pre-baking units 81 to 84 each for heating-processing the wafer W after the resist coating treatment, and post-baking units 85 to 89 each for heating-processing the wafer W after the developing treatment, are ten-tiered in order from the bottom.

In the fifth processing unit group G5, a plurality of thermal processing units each for thermally processing the wafer W, for example, high-precision temperature regulating units 90 to 93, and post-exposure baking units 94 to 99, are ten-tiered in order from the bottom.

As shown in FIG. 1, on the side of the positive direction in the X-direction of the first transfer unit 30, a plurality of processing and treatment units are arranged, for example, adhesion units 100 and 101 each for performing hydrophobic treatment on the wafer W and heating processing units 102 and 103 each for heating-processing the wafer W being four-tiered in order from the bottom as shown in FIG. 3. As shown in FIG. 1, on the side of the positive direction in the X-direction of the second transfer unit 31, for example, an edge exposure unit 104 is disposed which selectively exposes only the edge portion of the wafer W to light.

In the interface station 5, for example, a wafer transfer body 111 moving on a transfer path 110 extending in the X-direction and a buffer cassette 112 are provided as shown in FIG. 1. The wafer transfer body 111 is movable in the Z-direction and also rotatable in the θ-direction and thus can access the aligner A adjacent to the interface station 5, the buffer cassette 112, and the fifth processing unit group G5 and transfer the wafer W to them.

Figure 4:
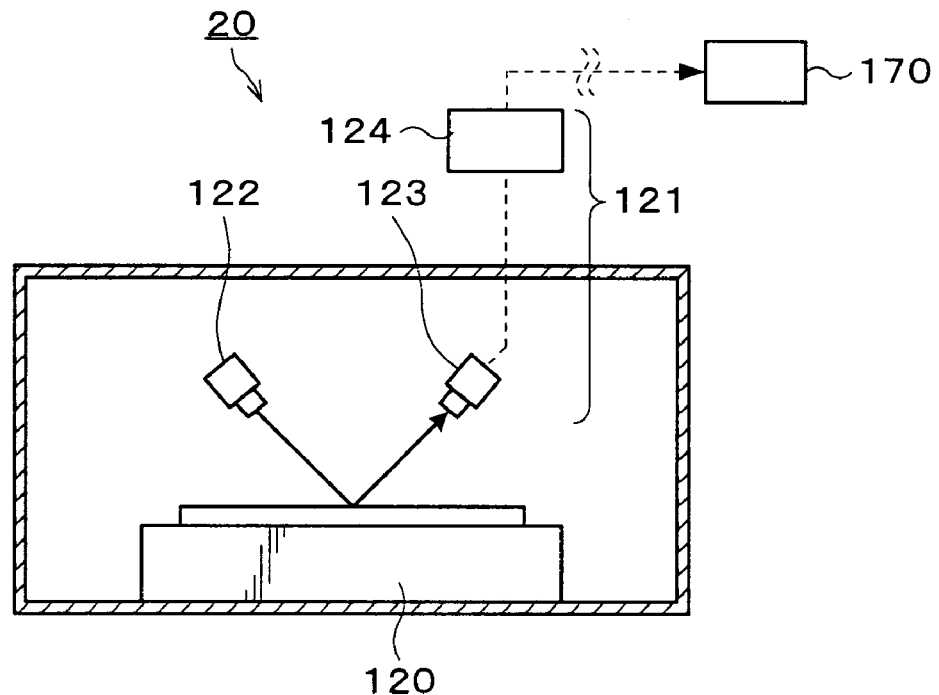
[FIG. 4]
A longitudinal sectional view showing the outline of a configuration of a pattern dimension measuring unit.

Next, a configuration of the above-described pattern dimension measuring unit 20 will be described. The pattern dimension measuring unit 20 comprises, for example, a mounting table 120 for horizontally mounting the wafer W and an optical profilometer 121 as shown in FIG. 4. The mounting table 120 is, for example, an X-Y stage and movable in two dimensional directions in the horizontal directions. The optical profilometer 121 comprises, for example, a light applying unit 122 for applying light to the wafer W from an oblique direction, a light detecting unit 123 for detecting the light applied from the light applying unit 122 and reflected off the wafer W, and a measuring unit 124 for calculating the dimension of the pattern on the wafer W based on the information on the light received by the light detecting unit 123. The pattern dimension measuring unit 20 according to this embodiment, which is for measuring the dimension of the pattern using, for example, the Scatterometry method, can measure the dimension of the pattern by matching the light intensity distribution within the wafer detected by the light detecting unit 123 to a virtual light intensity distribution stored in advance to obtain the dimension of the pattern corresponding to the matched virtual light intensity distribution.

The pattern dimension measuring unit 20 can measure the dimension of the pattern in a predetermined region within the wafer by horizontally moving the wafer W relative to the light applying unit 122 and the light detecting unit 123. Note that the dimension measurement result of the pattern by the pattern dimension measuring unit 20 can be outputted to a later-described control unit 170.

Next, a configuration of the control unit 170 for controlling the wafer processing performed in the above-described coating and developing treatment system 1 will be described. For example, the control unit 170 is composed, for example, of a general-purpose computer comprising a CPU and a memory.

Figure 5:
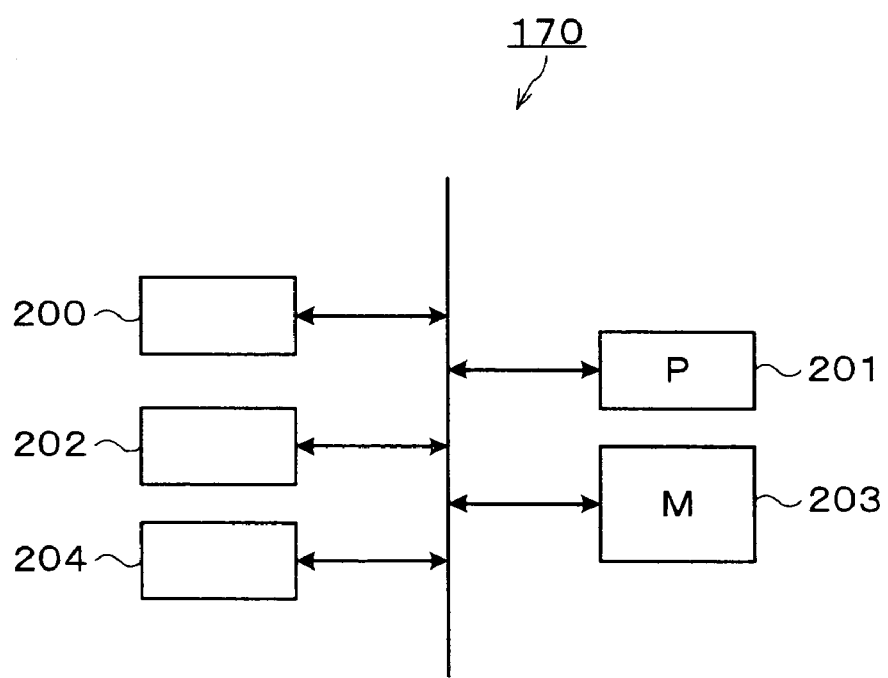
[FIG. 5]
A block diagram showing a configuration of a control unit.

The control unit 170 comprises, for example, as shown in FIG. 5, an input part 200 into which the dimension measurement result of the pattern formed by patterning for the first time is inputted from the pattern dimension measuring unit 20; a program storage part 201 for storing a program P for deviating conditions of patterning for the second time and subsequent times from the inputted dimension measurement result of the patterning for the first time; a calculation part 202 for executing the program P to deviate conditions of patterning for the second time and subsequent times; a data storage part 203 for storing various kinds of information required for the calculation; and an output part 204 for outputting and setting the calculated conditions of the patterning for the second time and subsequent times into a predetermined processing unit.

Figure 6:
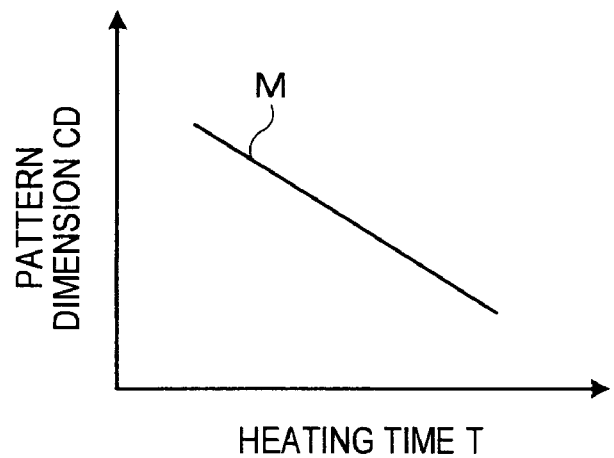
[FIG. 6]
A graph showing a correlation between the pattern dimension and the heating time of post-exposure baking.

The data storage part 203 stores, for example, data indicating a correlation M between a heating time T as a heating processing condition in the post-exposure baking units 94 to 99 and a pattern dimension CD formed by the wafer processing in the coating and developing treatment system 1, for example, as shown in FIG. 6.

The program P stored in the program storage part 201 can calculate the difference between the dimension of the pattern for the first time and a target dimension of the patterning for the first time (a first-time dimensional difference), for example, based on the dimension measurement result of the pattern for the first time. The program P can also calculate a condition of the patterning for the second time and subsequent times, for example, the heating time T of the post-exposure baking such that the difference between the patterns for the second time and subsequent times and their target dimensions is equal to the first-time dimensional difference. For the calculation of the heating time T, for example, the correlation M in the data storage part 203 is used. The target dimensions of the patterns for the first time and the second time are stored, for example, in the data storage part 203 in advance. Note that the program P is one causing a computer to implement the wafer processing. The program P may also be one recorded on a computer storage medium and installed from the storage medium into the control unit 170.

Figure 7:
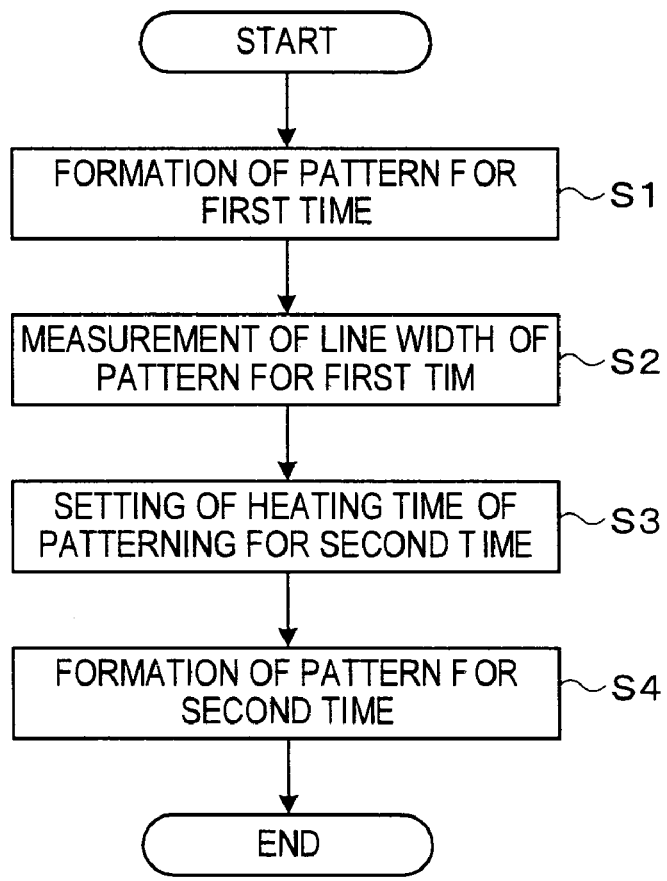
[FIG. 7]
A flowchart of wafer processing.

Next, the process of processing the wafer W in the coating and developing treatment system 1 configured as described above will be described. FIG. 7 is a flow showing one example of the process of processing the wafer W. In this embodiment, a case will be described as an example, in which patterning is individually performed on two regions on the wafer W in turn to thereby perform patterning two times in total. The two regions on the wafer W are divided, for example, into a region where a pattern is densely formed which is used for a memory cell of a DRAM, and a region where a pattern is coarsely formed which is used for a peripheral circuit of the DRAM.

Figure 8:
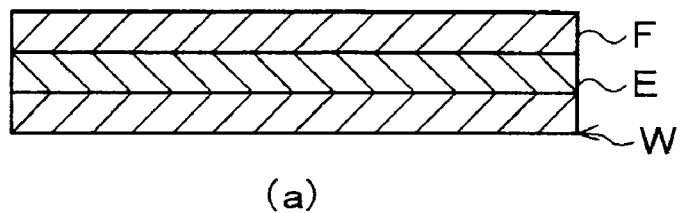
[FIG. 8]
(a) being a longitudinal sectional view of the wafer before processing, (b) being a longitudinal sectional view of the wafer on which a resist film for the first time is formed, (c) being a longitudinal sectional view of the wafer having a resist pattern formed in a first region, and (d) being a longitudinal sectional view showing a state in which a pattern is formed in a film to be worked in the first region.
Figure 8:
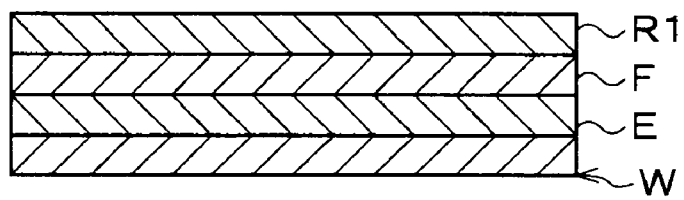
Figure 8:
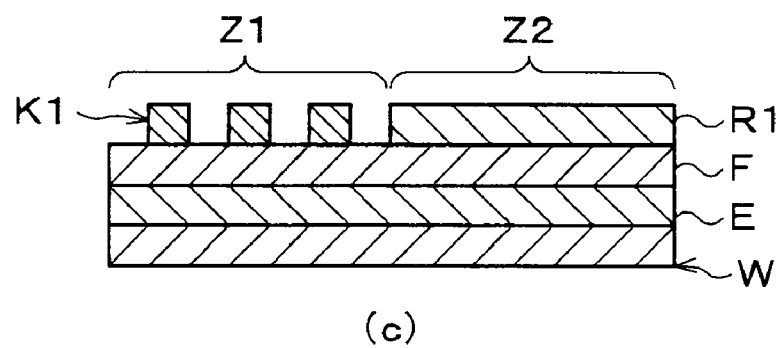
Figure 8:
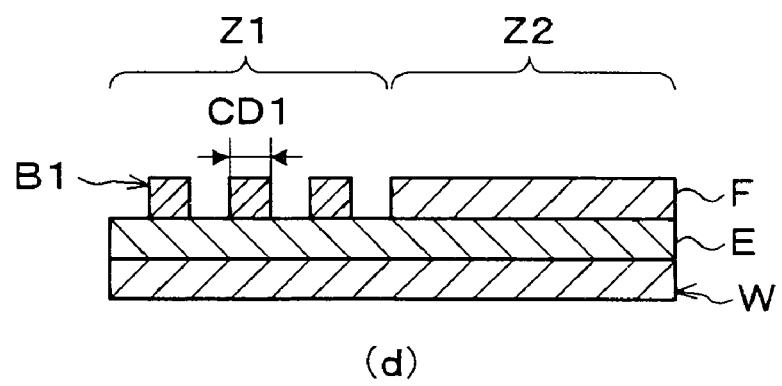

The wafer W to be processed has, for example, a lower-layer film E such as an organic lower-layer film is formed on its surface and an SOG (Spin On Glass) film F as a film to be worked on top of the lower-layer film E is formed, in advance, as shown in FIG. 8(a), and is housed in the cassette C on the cassette mounting table 6. Then, the wafers W are first taken out of the cassette C one by one by the wafer transfer body 8 shown in FIG. 1, and sequentially transferred to the transition unit 10 in the inspection station 3. The wafer W transferred to the transition unit 10 is transferred by the wafer transfer unit 12 to the processing station 4. The wafer W is transferred to the temperature regulating unit 70 included in the third processing unit group G3 in the processing station 4 where the wafer W is temperature-regulated to a predetermined temperature, and is then transferred by the first transfer unit 30, and then transferred by the first transfer unit 30 to the resist coating unit 40. In the resist coating unit 40, the resist solution is applied, for example, to the front surface of the wafer W to form a resist film R1 for the first time as shown in FIG. 8(b).

The wafer W on which the resist film R1 for the first time has been formed is transferred by the first transfer unit 30, for example, to the pre-baking unit 81 where it is subjected to heating processing, and then transferred by the second transfer unit 31 to the edge exposure unit 104 and the high-precision temperature regulating unit 93 in sequence so that predetermined processing is performed in each of the units. Thereafter, the wafer W is transferred by the wafer transfer body 111 in the interface station 5 to the aligner A where a predetermined pattern is exposed, for example, in the resist film R1 in a first region of the wafer W. The wafer W for which exposure processing has been finished is transferred by the wafer transfer body 111, for example, to the post-exposure baking unit 94 in the processing station 4 where the wafer W is subjected to heating processing (post-exposure baking).

The wafer W for which heating processing has been finished is transferred by the second transfer unit 31 to the-prebaking unit 81 where it is temperature-regulated, and is then transferred to the developing treatment unit 50 where the resist film R1 on the wafer W is developed, whereby a resist pattern K1 is formed in a first region Z1 on the wafer W as shown in FIG. 8(c). The wafer W is then transferred by the second transfer unit 31 to the post-baking unit 85 where the wafer W is subjected to post-baking, and then transferred by the first transfer unit 30 to the high-precision temperature regulating unit 72 where the wafer W is temperature-regulated. The wafer W is then returned, for example, by the wafer transfer unit 12 and the wafer transfer body 8 to the cassette C in the cassette station 2. The SOG film F being the film to be worked above the wafer W returned to the cassette C is etched using the resist pattern K1 as a mask, for example, by a not-shown etching unit, and the resist pattern K1 is then peeled. Thus, the patterning for the first time is finished, resulting in formation of a pattern B1 for the first time in the first region Z1 of the wafer W as shown in FIG. 8(d) (Step S1 in FIG. 7).

The wafer W on which the pattern B1 for the first time has been formed in the first region Z1 is transferred, for example, again by the wafer transfer body 8 from the cassette C to the inspection station 3 and transferred by the wafer transfer unit 12 to the pattern dimension measuring unit 20.

In the pattern dimension measuring unit 20, the wafer W is mounted on the mounting table 120, and the dimension of the pattern B1 for the first time in the first region Z1 of the wafer W, for example, the line width CD1 is measured by the optical profilometer 121 (Step S2 in FIG. 7). The result of the line width measurement of the pattern B1 for the first time is outputted to the control unit 170.

Figures 10, 11:
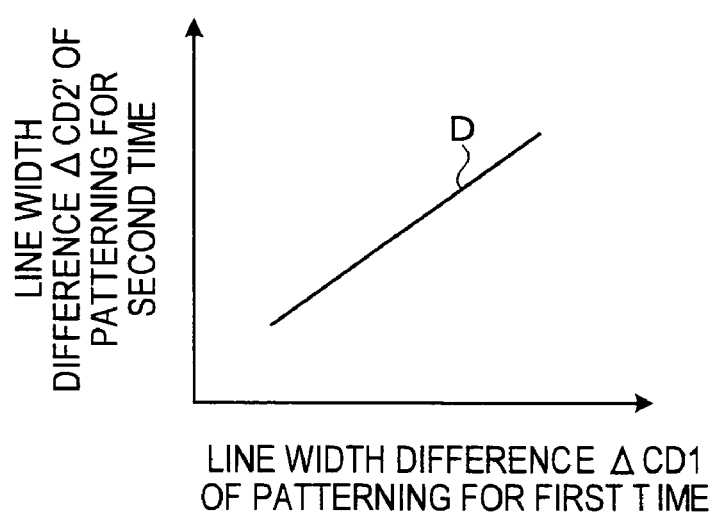
[FIG. 10]
A table showing the relations between the patterning for the first time and the second time and the line width, the target line width and the line width difference.
[FIG. 11]
A graph showing the correlation between the line width difference of the patterning for the first time and the line width difference of the patterning for the second time.

For example, in the control unit 170, the program P calculates a line width difference $\Delta CD1$ (CD1a-CD1) between the line width CD1 of the pattern B1 for the first time and its target line width CD1a from the line width measurement result of the pattern B1 for the first time as shown in FIG. 10. The target line width CD1a in this event is set in advance in the control unit 170. When the line width CD1 is 52 nm and the target line width CD1a is 50 nm, the line width difference $\Delta CD1$ results in +2 nm. The program P then further calculates the heating time T of the post-exposure baking so that the line width difference $\Delta CD1$ of the patterning for the first time is equal to a line width difference $\Delta CD2$ (CD2a-CD2) between a line width CD2 of a pattern by patterning for the second time performed subsequent thereto and its target line width CD2a. The heating time T is obtained from the correlation M shown in FIG. 6. For example, when the target line width CD2a is 100 nm, the heating time T to bring the line width CD to 102 nm is obtained.

The calculated heating time T is then outputted from the control unit 170 to the post-exposure baking units 97 to 99, so that the new heating time T is set (Step S3 in FIG. 7)

Figure 9:
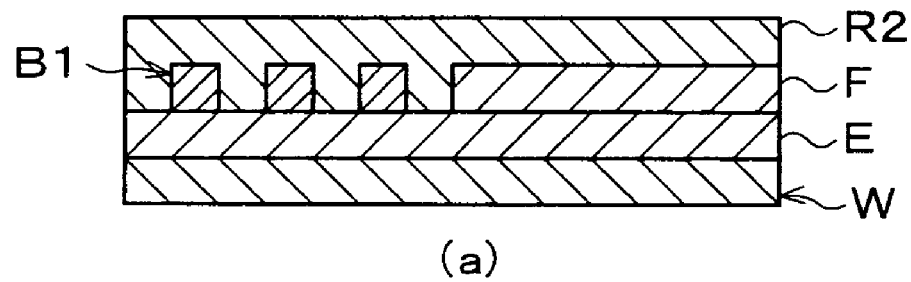
[FIG. 9]
(a) being a longitudinal sectional view of the wafer on which a resist film for the second time is formed, (b) being a longitudinal sectional view of the wafer having a resist pattern formed in a second region, and (c) being a longitudinal sectional view of the wafer having a pattern formed in the film to be worked in the second region.
Figure 9:
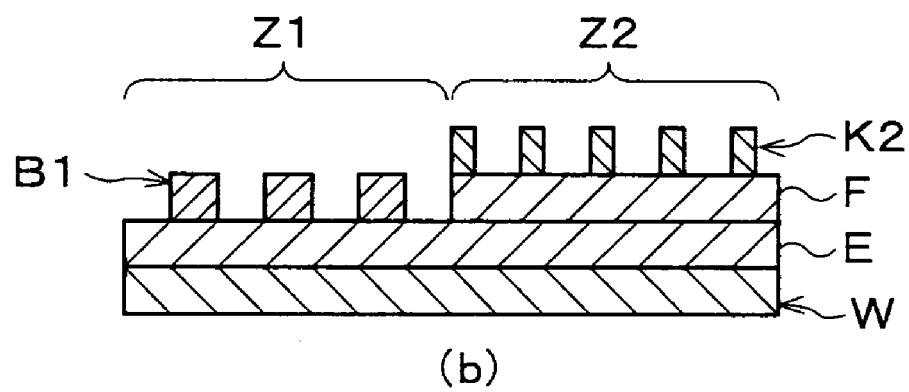
Figure 9:
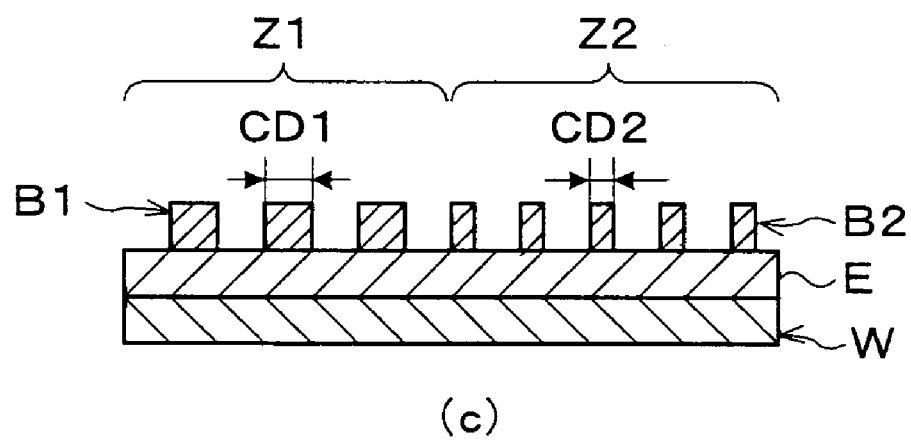

The wafer W is then transferred, for example, from the inspection station 3 again to the processing station 4 where patterning for the second time similar to the above-described patterning for the first time is performed. For example, the wafer W is transferred to the resist coating unit 41 where a resist film R2 for the second time is formed on the SOG film F above the wafer W as shown in FIG. 9(a). The wafer W is then transferred to the pre-baking units 82 and the aligner A in sequence. In the aligner A, the resist film R2 in the second region on the wafer W is exposed into a predetermined pattern. The wafer W for which exposure processing has been finished is transferred to the post-exposure baking unit 95, the developing treatment unit 51, the post-baking unit 86 and the like in sequence so that a resist pattern K2 for the second time is formed as shown in FIG. 9(b). The wafer W is further returned to the cassette C in the cassette station 2, then the SOG film F is etched by the etching unit, and the resist pattern K2 is then peeled. Thus, the pattern B2 for the second time is formed in the second region Z2 of the wafer W as shown in FIG. 9(c) (Step S4 in FIG. 7).

The wafer W on which the pattern B2 for the second time has been formed in the second region Z2 is transferred by the wafer transfer unit 12 to the transition unit 10 in the inspection station 3 and returned by the wafer transfer body 8 from the transition unit 10 to the cassette C. Thus, a series of wafer processing ends.

According to the above embodiment, in the wafer processing of performing patterning twice on the same layer above the front surface of the wafer W, the line width CD1 of the pattern B1 in the first region Z1 formed by the patterning for the first time is measured, and the condition of the patterning for the second time on the second region Z2 is set based on the line width measurement result, so that the line width CD2 of the pattern B2 by the patterning for the second time can be positively adjusted based on the line width CD1 of the pattern B1 for the first time. As a result, the line width of the pattern formed in every patterning never irregularly varies, whereby a desired pattern can be finally formed on the wafer W.

Further, since the condition of the patterning for the second time is set so that the line width difference $\Delta CD1$ of the patterning for the first time is equal to the line width difference $\Delta CD2$ of the patterning for the second time, patterns having the same error are formed in the first region Z1 and the second region Z2 on the wafer W. As a result, in the etching step for the lower-layer film E using the patterns B1 and B2 as a mask performed in the post process, the lower-layer film can be worked into a desired dimension within the entire wafer by etching it after correcting the etching amount by the error amount (for example, +2 nm).

Further, since the heating time T of the post-exposure baking in the photolithography step is changed as the condition of the patterning for the second time, the line width CD2 of the pattern B2 for the second time can be adjusted relatively easily, and accurately.

Note that, in place of the heating time T of the post-exposure baking, the heating temperature may be changed as the condition of the patterning for the second time. Further, as the condition of the patterning for the second time, the exposure condition in the exposure processing, for example, the exposure amount, the focus or the like may be changed. Further, as the condition of the patterning for the second time, the developing condition in the developing treatment, for example, the developing time may be changed.

For setting the condition of the patterning for the second time in the above embodiment, the correlation between the line width difference $\Delta CD1$ of the patterning for the first time when performing the patterning on the current condition setting and the line width difference of the patterning for the second time may be obtained in advance, so that the correlation may be used to obtain an appropriate condition of the patterning for the second time. For example, a correlation D between the line width difference ΔCD1 of the patterning for the first time when performing the patterning on the current condition setting and the line width difference ΔCD2' of the patterning for the second time is obtained in advance. The correlation D is stored, for example, into the data storage part 203.

In the wafer processing, the patterning for the first time is first performed as in the above embodiment, the line width CD1 of the pattern B1 for the first time is measured, and the line width difference ΔCD1 being the difference between the line width CD1 and the target line width CD1a is calculated. From the line width difference ΔCD1 and the correlation D, the line width difference ΔCD2' of the patterning for the second time on the current condition setting is obtained. A new condition of the patterning for the second time is obtained using the correlation M or the like so that the line width difference ΔCD2' is equal to the line width difference ΔCD1. For example, when the line width difference ΔCD1 of the patterning for the first time is +2 nm and the line width difference ΔCD2' is calculated to be +4 nm from the correlation D, the condition of the patterning for the second time is obtained so that the line width CD2 of the pattern B2 for the second time is corrected by −2 nm whereby the line width difference ΔCD2 is +2 nm. According to this example, the condition of the patterning for the second time can be obtained more accurately.

Figure 12:
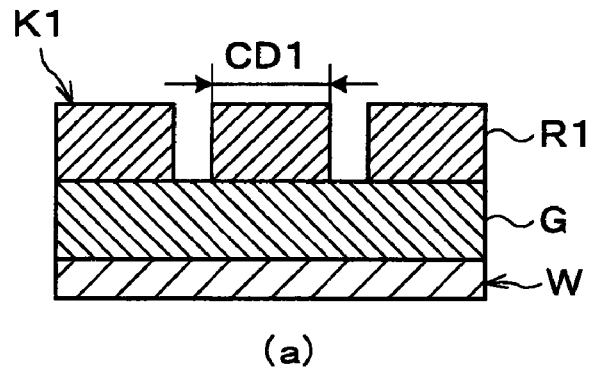
[FIG. 12]
(a) being a longitudinal sectional view of the wafer showing a state in which a resist pattern for the first time is formed, (b) being a longitudinal sectional view of the wafer showing a state in which a pattern for the first time is formed by etching the film to be worked, (c) being a longitudinal sectional view of the wafer showing a state in which a resist pattern for the second time is formed, and (d) being a longitudinal sectional view showing a state in which a pattern for the second time is formed by etching the film to be worked.
Figure 12:
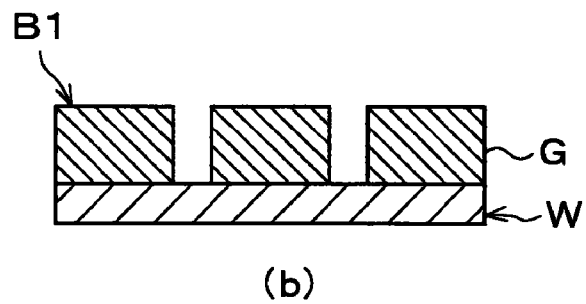
Figure 12:
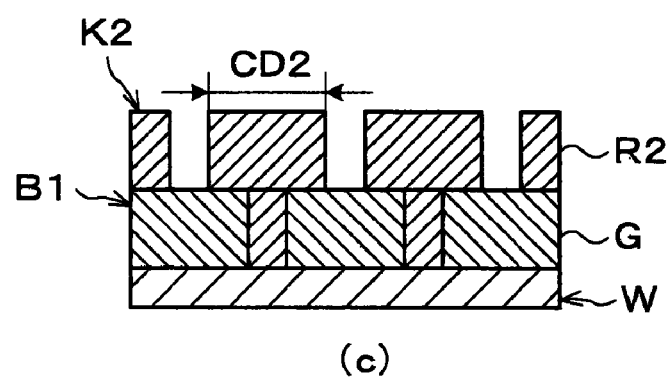
Figure 12:
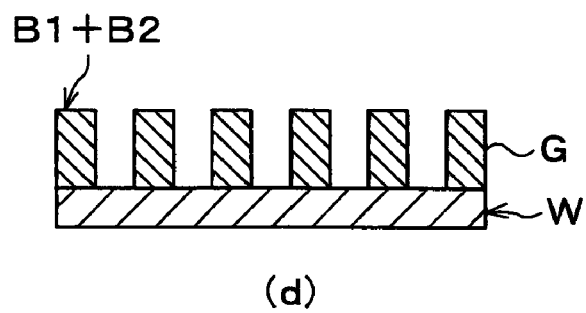

Although the SOG film F in the first region Z1 of the wafer W is patterned by the patterning for the first time and the SOG film F in the second region Z2 is patterned by the patterning for the second time in the above embodiment, the present invention is also applicable to the case in which patterning is repeatedly performed a plurality of times on the film to be worked in the same region of the wafer W. For example, as shown in FIG. 12, a resist pattern K1 for the first time is formed in a resist film R1 above the front surface of the wafer W ((a) in FIG. 12). A film to be worked G being a base film is then etched using the resist pattern K1 as a mask, and the resist pattern K1 is then removed to form a pattern B1 for the first time ((b) in FIG. 12). Thereafter, a resist film R2 is applied again, and a resist pattern K2 for the second time is then formed with the exposed portion being shifted in the same region on the wafer W ((c) in FIG. 12). Thereafter, the film to be worked G being the base film is etched using the resist pattern K2 as a mask, and the resist pattern K2 is then removed, whereby a pattern B2 for the second time is formed to be superposed on the pattern B1 ((d) in FIG. 12). In this case, the film to be worked on the wafer W can also be worked into a desired dimension by setting the condition of the patterning for the second time based on the line width CD1 of the pattern B1 by the patterning for the first time.

Although the dimension of the pattern B1 of the SOG film F for the first time is measured and the condition of the patterning for the second time is set based on that dimension in the above embodiment, the dimension of the resist pattern K1 for the first time may be measured and the condition of the patterning of the SOG film F for the second time may be set based on that dimension. Further, the condition of the patterning of the resist film for the second time may be based on the dimension of the resist pattern K1 for the first time. In this case, the resist film is the film to be worked in the present invention.

Note that a cleaning unit may be incorporated in the coating the developing treatment system 1 so that the rear surface of the wafer W may be cleaned in the cleaning unit after the patterning for the first time is finished and before the patterning for the second time is performed in the above embodiment. This removes the dirt on the rear surface of the wafer W adhering due to the patterning for the first time to improve the positional accuracy of the wafer W, for example, during processing, so that the patterning for the second time can be accurately performed. The cleaning treatment for the rear surface of the wafer W may be performed immediately before the exposure processing for the patterning for the second time. Further, the cleaning treatment may be both before start of the patterning for the second time and before the exposure processing. Further, optical cleaning may be used as the cleaning technique.

Although the heating time of the post-exposure baking is changed as the condition of the patterning for the second time in the above embodiment, the etching time of the film to be worked may be changed in place of the heating time. In this case, the patterning for the first time is performed on a first film to be worked, and the patterning for the second time is performed on a second film to be worked which is formed in the same layer as the first film to be worked after the patterning for the first time. As the condition of the patterning for the second time, the etching time of the second film to be worked is changed.

Figure 13:
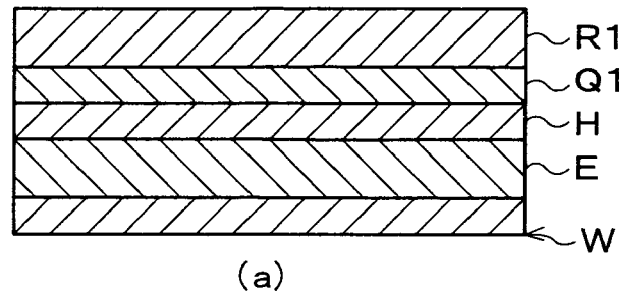
[FIG. 13]
(a) being a longitudinal sectional view of the wafer before processing, (b) being a longitudinal sectional view of the wafer on which a resist pattern for the first time is formed, (c) being a longitudinal sectional view of the wafer on which a pattern of an anti-reflection film for the first time is formed, (d) being a longitudinal sectional view of the wafer on which a pattern for the first time is formed, and (e) being a longitudinal sectional view showing a state in which the resist pattern for the first time and the pattern of the anti-reflection film for the first time are removed.
Figure 13:
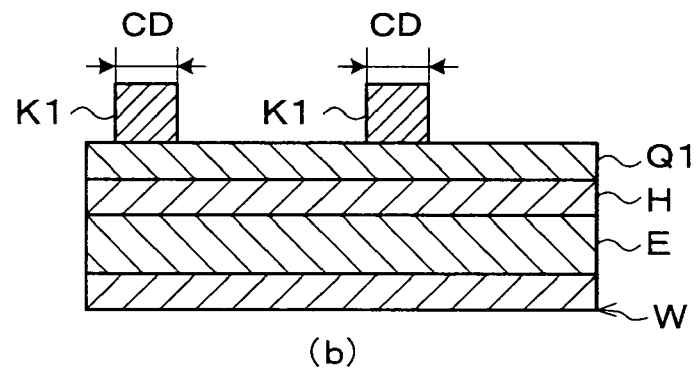
Figure 13:
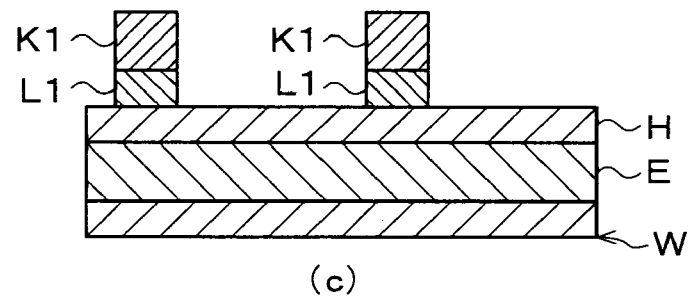
Figure 13:
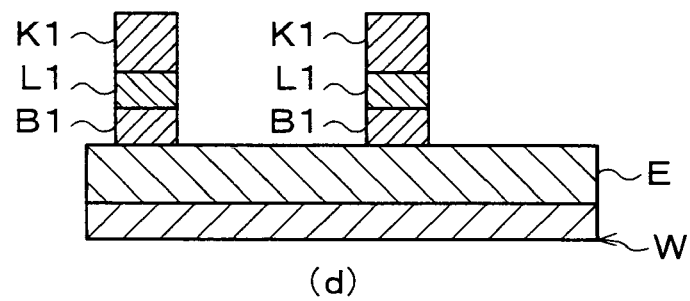
Figure 13:
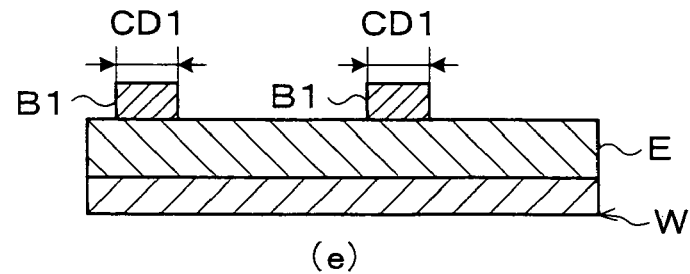

On the wafer W to be processed, for example, as shown in FIG. 13 (a), the lower-layer film E such as an organic lower-layer film and an oxide film H as the first film to be worked are formed in order from the bottom on its front surface in advance. After an anti-reflection film Q1 is then formed on the oxide film H above the front surface of the wafer W in the bottom coating unit 43, a resist film R1 is formed in the resist coating unit 40 ((a) in FIG. 13). Thereafter, various kinds of processing and treatment such as the exposure processing, the developing treatment, and so on are performed on the resist film R1 above the front surface of the wafer W, whereby a resist pattern K1 for the first time is formed. For the wafer W on which the resist pattern K1 for the first time has been formed, the dimension of the resist pattern K1 for the first time, for example, the line width CD is measured in the pattern dimension measuring unit 20 ((b) in FIG. 13).

Figure 14:
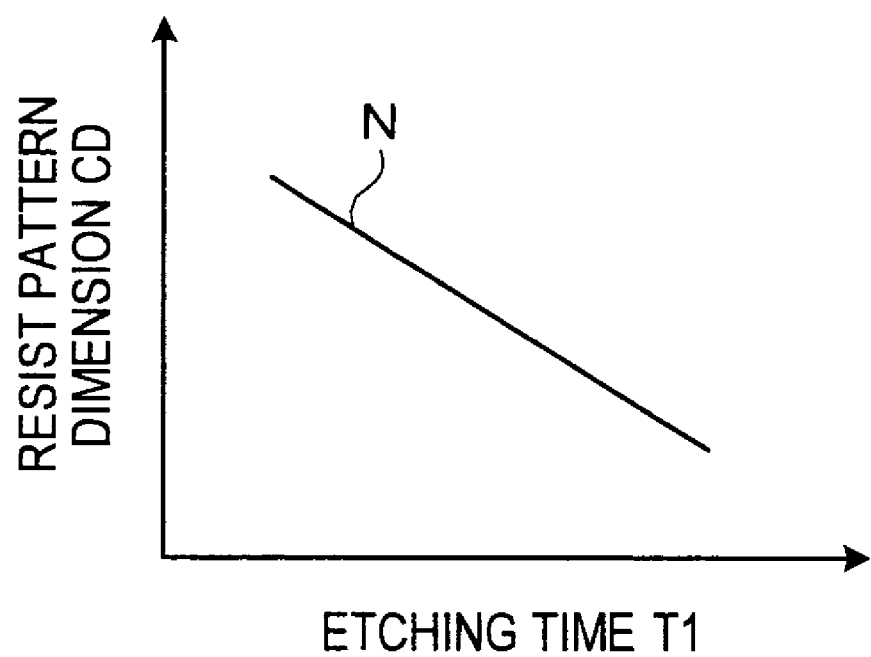
[FIG. 14]
A graph showing the correlation between the resist pattern dimension and the etching time of the anti-reflection film.

The measurement result of the line width CD of the resist pattern K1 for the first time is outputted to the control unit 170. The data storage part 203 of the control unit 170 stores data indicating a correlation N between the line width CD of the resist pattern K1 and the etching time T1 of the anti-reflection film Q1 as shown in FIG. 14. The correlation N is individually created so as to adapt to the film thickness and the kind of the anti-reflection film Q1 or the characteristics of the etching unit for etching the anti-reflection film Q1. The program P in the control unit 170 uses the correlation N to obtain the etching time T1 of the anti-reflection film Q1 from the measurement result of the line width CD of the resist pattern K1 for the first time. Based on the obtained etching time T1, the anti-reflection film Q1 is subjected to the etching treatment using the resist pattern K1 for the first time as a mask in the not-shown etching unit, whereby a pattern L1 is formed ((c) in FIG. 13). The oxide film H1 is subjected to etching treatment using the resist pattern K1 for the first time and the pattern L1 of the anti-reflection film Q1 a mask, whereby the pattern B1 for the first time is formed ((d) in FIG. 13). The resist pattern K1 for the first time and the pattern L1 of the anti-reflection film Q1 for the oxide film H are peeled. For the wafer W on which the pattern B1 for the first time has been thus formed, the line width CD1 of the pattern B1 for the first time is measured ((e) in FIG. 13). The measurement result of the line width CD1 of the pattern B1 for the first time is outputted to the control unit 170.

Figure 15:
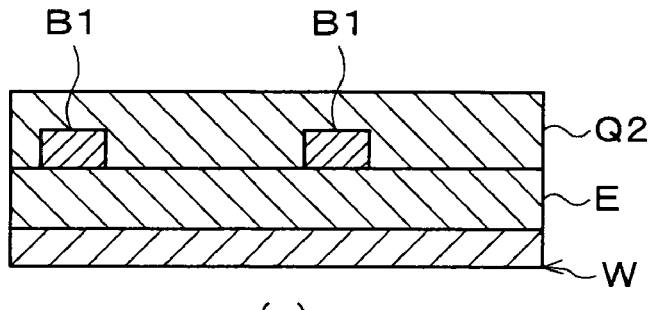
[FIG. 15]
(a) being a longitudinal sectional view of the wafer on which an anti-reflection film for the second time is formed, (b) being a longitudinal sectional view of the wafer on which a resist film for the second time is formed, (c) being a longitudinal sectional view of the wafer on which a resist pattern for the second time is formed, and (d) being a longitudinal sectional view of the wafer on which a pattern of the anti-reflection film for the second time is formed.
Figure 15:
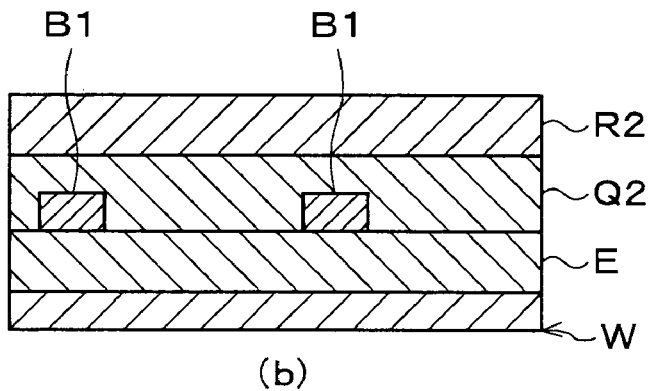
Figure 15:
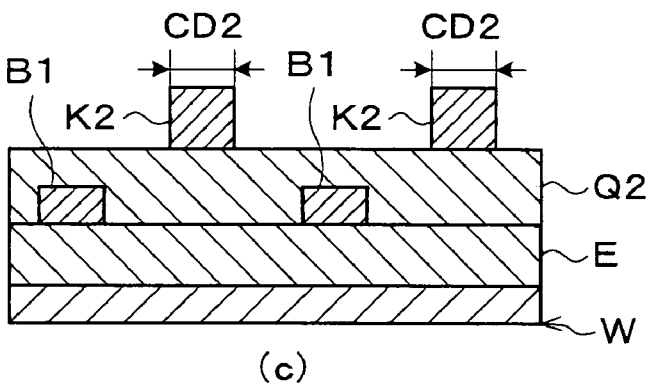
Figure 15:
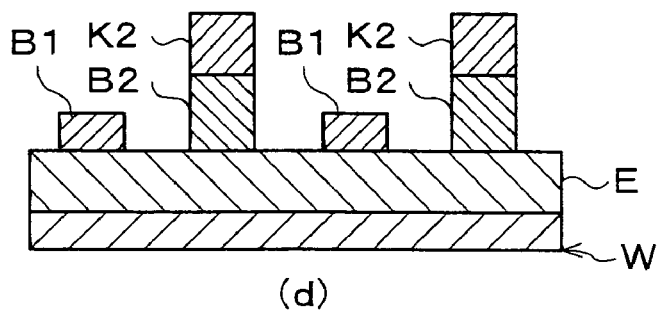

Next, in the bottom coating unit 43, an anti-reflection film Q2 as a second film to be worked is formed in the same layer as the pattern B1 for the first time has been formed. The anti-reflection film Q2 is formed to cover the pattern B1 for the first time ((a) in FIG. 15). Thereafter, in the resist coating unit 40, a resist film R2 is formed on the anti-reflection film Q2 ((b) in FIG. 15). Then, various kinds of processing and treatment such as the exposure processing, the developing treatment, and so on are performed on the resist film R2, whereby a resist pattern K2 for the second time is formed. The line width CD2 of the resist pattern K2 for the second time is measured in the pattern dimension measuring unit 20 ((c) in FIG. 15).

Figures 16, 17:
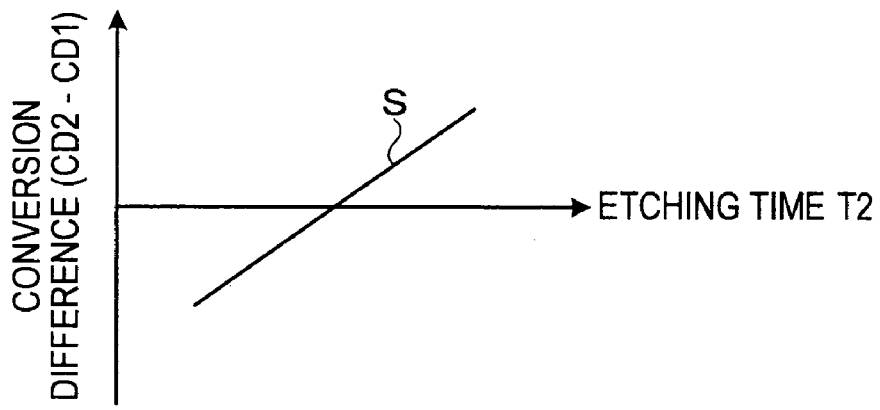
[FIG. 16]
A graph showing the correlation between a difference between the line width of the pattern for the first time and the line width of the resist pattern for the second time (a conversion difference) and the etching time of the anti-reflection film.
[FIG. 17]

The measurement result of the line width CD2 of the resist pattern K2 for the second time is outputted to the control unit 170. The data storage part 203 of the control unit 170 stores data indicating a correlation S between the difference in the line width obtained by subtracting the line width CD1 of the pattern B1 for the first time from the line width CD2 of the resist pattern K2 for the second time (hereinafter, referred to as a conversion difference) and the etching time T2 of the anti-reflection film Q2 as shown in FIG. 16. The correlation S is individually created so as to adapt to the film thickness and the kind of the anti-reflection film Q2 or the characteristics of the etching unit for etching the anti-reflection film Q2. The program P in the control unit 170 obtains the etching time T2 of the anti-reflection film Q2 based on the measurement result of the line width CD1 of the pattern B1 for the first time and the measurement result of the line width CD2 of the resist pattern K2 for the second time so that the line width CD1 of the pattern B1 for the first time is equal to the line width of a later-described pattern B2 for the second time of the anti-reflection film Q2. The etching time T2 of the anti-reflection film Q2 is obtained using the correlation S shown in FIG. 16. For example, when the line width CD1 of the pattern B1 for the first time is 70.5 nm and the line width CD2 of the resist pattern K2 for the second time is 69.0 nm which is smaller than the line width CD1, the etching time T2 of the anti-reflection film Q2 is decreased (NO. 1 in FIG. 17) to bring the line width of the anti-reflection film Q2 to 70.5 nm that is identical to the line width CD1. Besides, when the line width CD1 of the pattern B1 for the first time is 70.5 nm and the line width CD2 of the resist pattern K2 for the second time is 71.0 nm which is larger than the line width CD1, the etching time T2 of the anti-reflection film Q2 is increased (NO. 2 in FIG. 17) to bring the line width of the anti-reflection film Q2 to 70.5 nm that is identical to the line width CD1. Based on the obtained etching time T2, the anti-reflection film Q2 is subjected to etching treatment in the not-shown etching unit, whereby the pattern B2 for the second time is formed ((d) in FIG. 15).

Thereafter, the lower-layer film E is etched using the pattern B1 for the first time of the oxide film H, the resist pattern K2 for the second time, and the pattern B2 for the second time as a mask, and the pattern B1 for the first time of the oxide film H, the pattern B2 for the second time of the anti-reflection film Q2, and the resist pattern K2 for the second time are peeled.

In the above embodiment, the etching time T1 of the anti-reflection film Q1 is first obtained based on the measurement result of the line width CD of the resist pattern K1 for the first time, and the pattern L1 of the anti-reflection film Q1 is obtained based on the etching time T1, so that the line width of the pattern L1 can be worked into a desired dimension. Since the oxide film H as the first film to be worked is etched using the pattern L1 as a mask to form the pattern B1 for the first time, the line width CD of the pattern B1 for the first time can be worked into a desired dimension. The etching time T2 of the anti-reflection film Q2 as the second film to be worked is obtained based on the measurement results of the line width CD1 of the pattern B1 for the first time and the line width CD2 of the resist pattern K2 for the second time, and the pattern B2 for the second time is formed based on the etching time T2, so that the line width CD2 of the pattern B2 for the second time can be worked into the same desired dimension as that of the line width CD1 of the pattern B1 for the first time. Accordingly, the first film to be worked and the second film to be worked on the wafer W can be worked into a desired dimension.

The preferred embodiments of the present invention have been described above with reference to the accompanying drawings, but the present invention is not limited to the embodiments. It should be understood that various changes and modifications will be readily apparent to those skilled in the art within the scope of the spirit as set forth in claims, and those should also be covered by the technical scope of the present invention. For example, though the number of times of patterning is two in the above embodiments, the present invention is also applicable to the case of three times or more. Further, the film to be worked in which a pattern is formed is not only limited to the SOG film but may be other kinds of films. Further, the dimension of the pattern to be measured is not only the line width but may also be the hole diameter or the like. Further, the present invention is also applied to processing of substrates other than the wafer W, such as an FPD (Flat Panel Display), a mask reticle for a photomask, and the like.

INDUSTRIAL APPLICABILITY

The present invention is useful in forming a pattern with a desired dimension by a plurality of times of patterning.

The invention claimed is:

1. A substrate processing method of performing patterning a plurality of times on films to be worked located in a same layer above a front surface of a substrate, said method comprising the steps of:
    performing patterning for a first time;
    measuring a dimension of a pattern formed by the patterning for the first time;
    setting a condition of patterning for a second time and subsequent times so that a difference between an actual dimension of the pattern for the first time and a target dimension of the patterning for the first time is equal to a difference between an actual dimension of a pattern for the second time and subsequent times and a target dimension of patterning for the second time; and
    performing the patterning for the second time and subsequent times under the set condition of patterning.

2. The substrate processing method as set forth in claim 1, wherein a correlation between a difference between the actual dimension of the pattern for the first time when performing patterning under current condition setting and the target dimension thereof and a difference between the dimension of the pattern for the second time and subsequent times and the target dimension thereof is obtained in advance, and the condition of patterning for the second time and subsequent times is set based on the correlation and the dimension measurement result of the patterning for the first time.

3. The substrate processing method as set forth in claim 1, wherein said setting of the condition of patterning for the second time and subsequent times is performed by changing a condition of heating processing performed after exposure processing and before developing treatment.

4. The substrate processing method as set forth in claim 1, wherein said setting of the condition of patterning for the second time and subsequent times is performed by changing a condition of exposure processing.

5. The substrate processing method as set forth in claim 1, wherein said setting of the condition of patterning for the second time and subsequent times is performed by changing a condition of developing treatment.

6. The substrate processing method as set forth in claim 1, wherein the substrate is divided into a plurality of regions, and patterning is performed on the film to be worked in each of the plurality of regions.

7. The substrate processing method as set forth in claim 1, wherein patterning is repeatedly performed a plurality of times on the films to be worked in a same region on the front surface of the substrate.

8. The substrate processing method as set forth in claim 1, wherein the patterning for the first time is performed on a first film to be worked,
wherein the patterning for the second time and subsequent times are performed on a second film to be worked formed in the same layer as the first film to be worked after the patterning for the first time, and
wherein said setting of the condition of patterning for the second time and subsequent times is performed by changing an etching time of the second film to be worked.

9. A non-transitory computer-readable storage medium storing a computer readable instructions,
said instructions running on a computer of a control unit for controlling a substrate processing system to cause the substrate processing system to perform a substrate processing method,
wherein the substrate processing method is for performing patterning a plurality of times on films to be worked located in a same layer above a front surface of a substrate, said method comprising the steps of:
performing patterning for a first time;
measuring a dimension of a pattern formed by the patterning for the first time;
setting a condition of patterning for a second time and subsequent times so that a difference between an actual dimension of the pattern for the first time and a target dimension of the patterning for the first time is equal to a difference between an actual dimension of a pattern for the second time and subsequent times and a target dimension of patterning for the second time; and
performing the patterning for the second time and subsequent times under the set condition of patterning.

10. The computer readable storage medium as set forth in claim 9,
wherein the patterning for the first time is performed on a first film to be worked,
wherein the patterning for the second time and subsequent times are performed on a second film to be worked formed in the same layer as the first film to be worked after the patterning for the first time, and
wherein said setting of the condition of patterning for the second time and subsequent times is performed by changing an etching time of the second film to be worked.

11. A substrate processing system for performing patterning a plurality of times on films to be worked located in a same layer above a front surface of a substrate, said system comprising:
a dimension measuring unit that measures a dimension of a pattern formed by patterning for a first time; and
a control unit that sets a condition of patterning for a second time and subsequent times using the dimension measurement result of the patterning for the first time so that a difference between an actual dimension of the pattern for the first time and a target dimension of the patterning for the first time is equal to a difference between an actual dimension of a pattern for the second time and subsequent times and a target dimension of patterning for the second time.

12. The substrate processing system as set forth in claim 11,
wherein said control unit sets the condition of patterning for the second time and subsequent times based on a correlation between a difference between the actual dimension of the pattern for the first time when performing patterning under current condition setting and the target dimension thereof and a difference between the dimension of the pattern for the second time and subsequent times and the target dimension thereof, and on the dimension measurement result of the patterning for the first time.

13. The substrate processing system as set forth in claim 11,
wherein the setting of the condition of patterning for the second time and subsequent times is performed by changing a condition of heating processing performed after exposure processing and before developing treatment.

14. The substrate processing system as set forth in claim 11,
wherein the setting of the condition of patterning for the second time and subsequent times is performed by changing a condition of exposure processing.

15. The substrate processing system as set forth in claim 11,
wherein the setting of the condition of patterning for the second time and subsequent times is performed by changing a condition of developing treatment.

16. The substrate processing system as set forth in claim 11,
wherein the substrate is divided into a plurality of regions, and patterning is performed on the film to be worked in each of the plurality of regions.

17. The substrate processing system as set forth in claim 11,
wherein patterning is repeatedly performed a plurality of times on the films to be worked in a same region on the front surface of the substrate.

18. The substrate processing system as set forth in claim 11,
wherein the patterning for the first time is performed on a first film to be worked,
wherein the patterning for the second time and subsequent times are performed on a second film to be worked formed in the same layer as the first film to be worked after the patterning for the first time, and
wherein said setting of the condition of patterning for the second time and subsequent times is performed by changing an etching time of the second film to be worked.

* * * * *